(12) United States Patent　(10) Patent No.: US 8,525,178 B2
Ichiryu et al.　(45) Date of Patent: Sep. 3, 2013

(54) FLEXIBLE SEMICONDUCTOR DEVICE AND METHOD FOR PRODUCING THE SAME

(75) Inventors: Takashi Ichiryu, Osaka (JP); Seiichi Nakatani, Osaka (JP); Koichi Hirano, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/498,700

(22) PCT Filed: Apr. 14, 2011

(86) PCT No.: PCT/JP2011/002203
§ 371 (c)(1),
(2), (4) Date: Mar. 28, 2012

(87) PCT Pub. No.: WO2011/142081
PCT Pub. Date: Nov. 17, 2011

(65) Prior Publication Data
US 2012/0181543 A1　Jul. 19, 2012

(30) Foreign Application Priority Data
May 12, 2010　(JP) .............................. P 2010-109837

(51) Int. Cl.
*H01L 29/04*　(2006.01)

(52) U.S. Cl.
USPC ......... 257/60; 257/57; 257/E23.065; 438/149

(58) Field of Classification Search
USPC ...................... 257/60, 57, E23.065; 438/149
See application file for complete search history.

(56) References Cited

U.S. PATENT DOCUMENTS

| | | | |
|---|---|---|---|
| 6,982,194 | B2 | 1/2006 | Tsunoda et al. |
| 7,189,997 | B2 | 3/2007 | Tsunoda et al. |
| 2002/0175328 | A1 | 11/2002 | Tsunoda et al. |
| 2003/0164500 | A1 | 9/2003 | Tsunoda et al. |
| 2010/0276691 | A1 | 11/2010 | Ichiryu et al. |
| 2010/0283054 | A1 | 11/2010 | Hirano et al. |

FOREIGN PATENT DOCUMENTS

| | | |
|---|---|---|
| JP | 2002-359376 | 12/2002 |
| JP | 2005-72053 | 3/2005 |
| JP | 2005-294300 | 10/2005 |

(Continued)

OTHER PUBLICATIONS

Machine Translation of JP 2009-122253.*
Machnine Translation of JP 2007-142022.*
Machine Translation of JP 2009-122253, Jun. 2009.*
Machine Translation of JP 2007-142022, Jun. 2007.*
International Preliminary Report on Patentability issued Dec. 20, 2012 in International (PCT) Application No. PCT/JP2011/002203.
International Search Report issued May 24, 2011 in International (PCT) Application No. PCT/JP2011/002203.

*Primary Examiner* — Julia Slutsker
(74) *Attorney, Agent, or Firm* — Wenderoth, Lind & Ponack, L.L.P.

(57) ABSTRACT

A flexible semiconductor device includes an insulating film on which a semiconductor element is formed. The top and bottom surfaces of the insulating film have a top wiring pattern layer and a bottom wiring pattern layer, respectively. The semiconductor element includes a semiconductor layer formed on the top surface of the insulating film, a source electrode and a drain electrode formed on the top surface of the insulating film so as to contact the semiconductor layer, and a gate electrode formed on the bottom surface of the insulating film so as to be opposite the semiconductor layer. A first thickness, which is the thickness of the insulating film facing the source electrode, the drain electrode, the top wiring pattern layer, and the bottom wiring pattern layer, is greater than a second thickness, which is the thickness of the insulating film between the gate electrode and the semiconductor layer.

33 Claims, 7 Drawing Sheets

(56) References Cited

FOREIGN PATENT DOCUMENTS

| | | |
|---|---|---|
| JP | 2006-186294 | 7/2006 |
| JP | 2007-67263 | 3/2007 |
| JP | 2007-142022 | 6/2007 |
| JP | 2009-122253 | 6/2009 |
| WO | 2010/016207 | 2/2010 |
| WO | 2010/032355 | 3/2010 |

* cited by examiner

Fig. 1
(a)
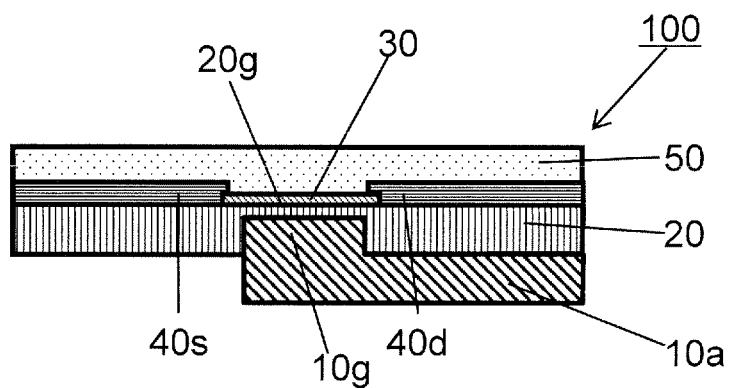
(b)
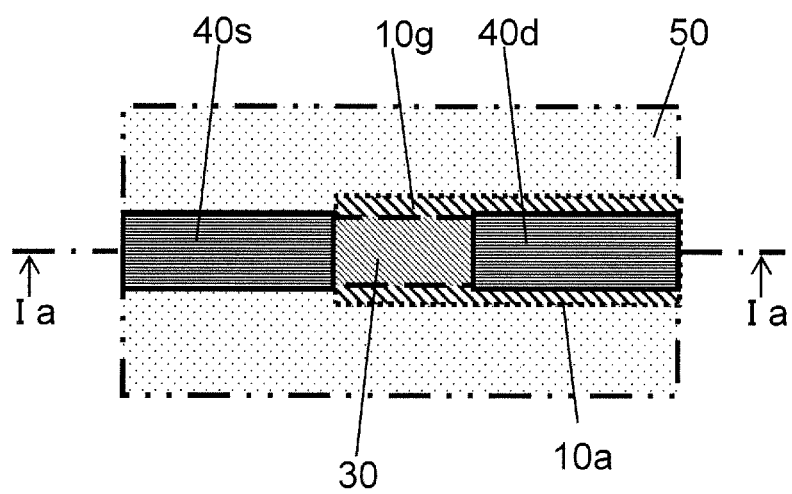

Fig. 6
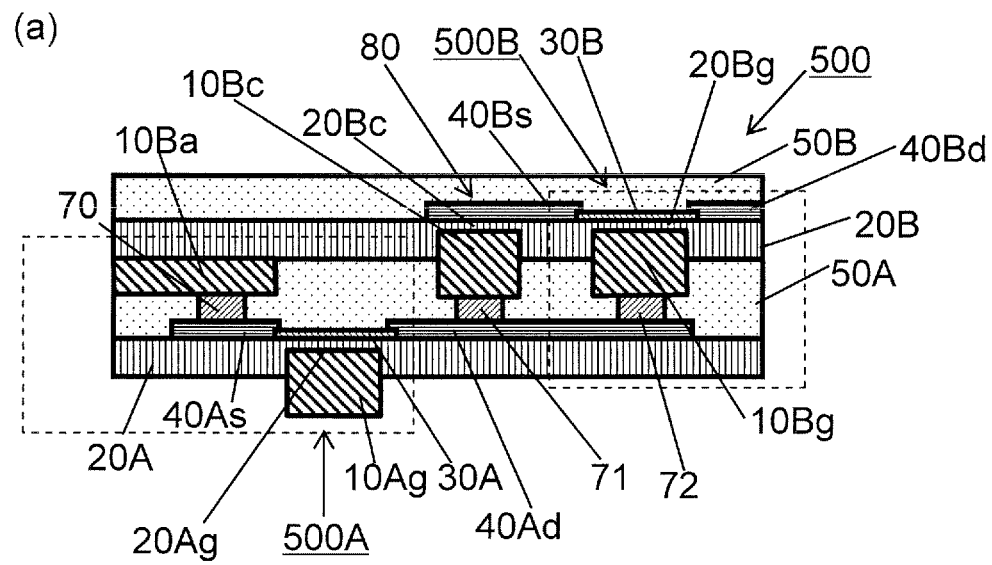
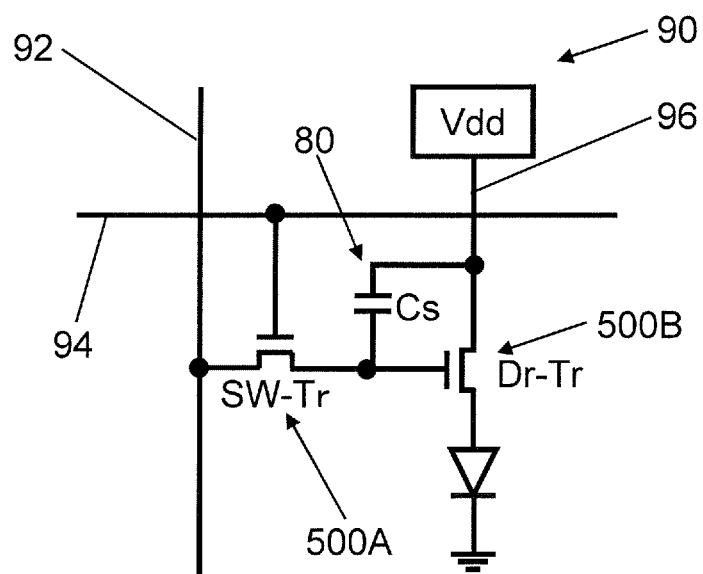

Fig. 7
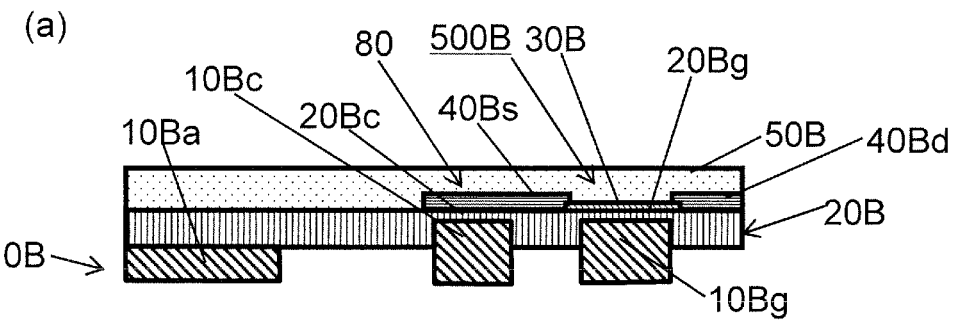
(a)
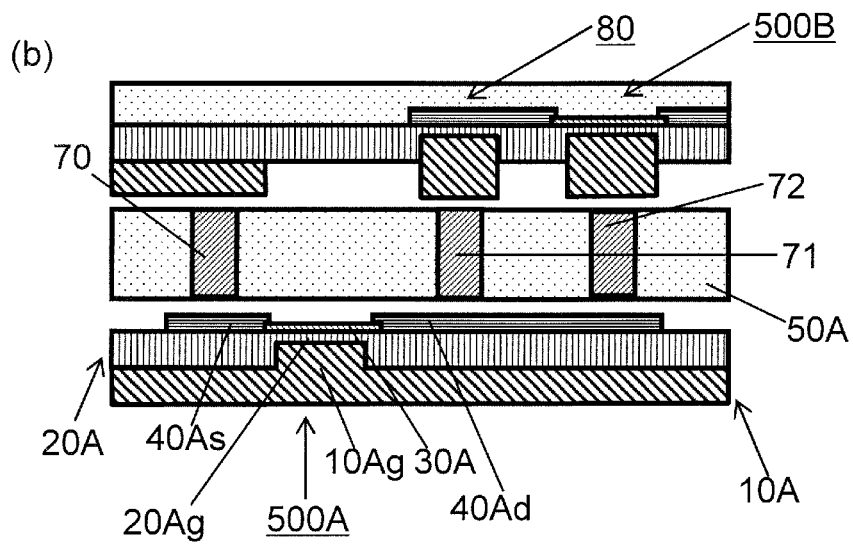
(b)
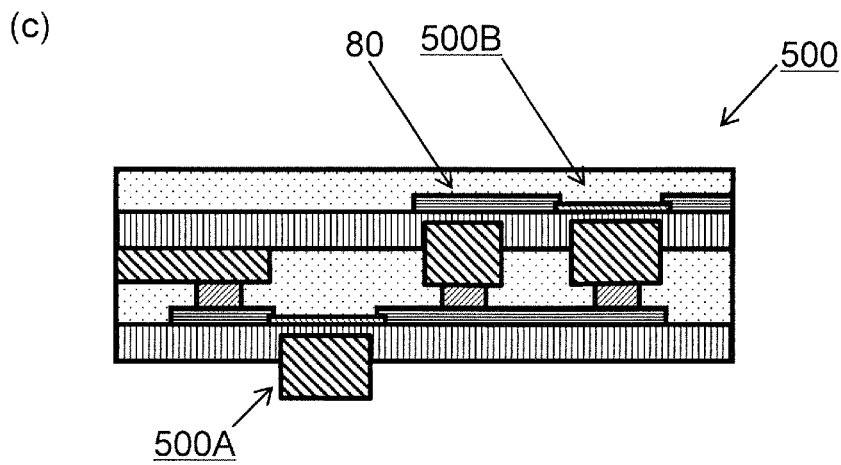
(c)

US 8,525,178 B2

FLEXIBLE SEMICONDUCTOR DEVICE AND METHOD FOR PRODUCING THE SAME

BACKGROUND OF THE INVENTION

I. Technical Field

The present invention relates to a flexible semiconductor device and a method for producing the same.

II. Description of the Related Art

There is a growing need for a flat panel display as a display for the use of a computer with the spread of information terminals. With the further progress of informatization, opportunities of computerization of information increases with respect to information conventionally provided through paper medium. Accordingly, a need for electronic paper or digital paper is growing as a thin, light, handy mobile display medium (for example, JP-A-2007-67263).

In a typical flat panel display, a presentation medium is formed by using an element utilizing liquid crystal, an organic EL (organic electroluminescence), an electrophoresis, and the like. In the above presentation medium, in order to secure uniformity of a brightness of a screen, an image rewrite rate, and the like, a technique in which active drive element (for example, TFT element) is used as an image drive element comes into mainstream. For example, a conventional computer display includes the TFT element formed on a substrate so as to include a liquid crystal, an organic EL device, and the like sealed therein. Herein, a semiconductor made of a-Si (amorphous silicon), p-Si (polysilicon), and the like can be mainly used as the TFT element. The TFT element is produced such that the Si semiconductors (as well as a metal film, as required) are multilayered and a source electrode, a drain electrode, and a gate electrode are sequentially formed on a substrate.

Since the formation of the TFT element by using the above-mentioned Si materials includes a high-temperature process, a substrate material for such TFT element is limited to a material that can withstand the process temperature. Therefore, a material having an excellent heat resistance property, i.e., a glass substrate, is actually required in forming the substrate. A quartz substrate can also be employable here, but is expensive and thus has an economic concern in an increased size of the display. In view of the above, the glass substrate is generally used as the substrate of the TFT element.

However, when the above-mentioned thin display is made of the conventional glass substrate, the display becomes heavy and lacks flexibility, resulting in leaving the possible disadvantage that the glass substrate may be broken due to a drop impact. The above-mentioned characteristics resulting from the formation of the TFT element on the glass substrate are not desirable very much in satisfying the needs for a convenient handy thin display in the developing process for informatization.

To meet the need for a light thin display, a semiconductor device (i.e., flexible semiconductor device) in which the TFT element is formed on a resin substrate (i.e., plastic substrate) is developed in view of the flexibility and light weight of the substrate. For example, JP-A-2005-294300 discloses a technique in which the TFT element is formed on a support (for example, glass substrate) by the process substantially identical to the conventional process and is thereafter separated from the glass substrate to be transferred to the resin substrate. A formation of the TFT element without using the glass substrate as the resulting composition member is developed in a manner as described below. Namely, in the formation, the TFT element is initially formed on the glass substrate and the glass substrate mounted with the TFT element is bonded on a resin substrate through a sealing layer made of, for example, an acrylic resin. Subsequently, the glass substrate is separated therefrom to transfer the TFT element onto the resin substrate.

SUMMARY OF THE INVENTION

The TFT element to be used for a display portion and a drive portion of the display device and peripheral circuits thereof require micronized, further integrated, and multilayered elements and wiring. However, when the TFT element is formed in the conventional manner in which the source electrode, the drain electrode, and the gate electrode are sequentially formed on the substrate to form a multilayered lamination, the multilayered wiring induces a parasitic capacitance across wiring provided on an upper layer and wiring provided on a lower layer via an insulating film therebetween. As a result thereof, the insulating film may raise a problem of bothering a high speed operation thereof. To reduce the parasitic capacitance, it is essential to take measures that, for example, the insulating film between the layers is to be made thicker and a low-dielectric constant material is to be used as the insulating film material.

On the other hand, in the capacitor portion installed in the semiconductor device and the circuits such as a TFT portion, various ideas are required in order to secure a large capacity thereof. Examples of the various ideas include a narrower wiring interval (i.e., insulating film thickness), formation of the dielectric substance layer (i.e., insulating film) of a capacitor portion by a process different from the above-mentioned insulating film, and a use of a high-dielectric constant material.

The present invention has been made in light of the above-mentioned conventional problems and a main object thereof is to provide a flexible semiconductor device in which the parasitic capacitance occurring between the multilayered wiring (i.e., wiring positioned up-and-down relationship) can be reduced as well as the capacity of the capacitor portion installed in the semiconductor device and the circuit can be expanded and a method for producing the same.

The present inventors have made an attempt to achieve the above object not by follow-on approach to the prior art but new direction approach.

In other words, a flexible semiconductor device according to the present invention includes an insulating film provided with a semiconductor device formed thereon, wherein the insulating film includes an upper wiring pattern layer on an upper surface thereof and a lower wiring pattern layer on a lower surface thereof, respectively, the semiconductor device includes:

a semiconductor layer formed on an upper surface of the insulating film;

a source electrode and a drain electrode formed on the upper surface of the insulating film so as to be in contact with the semiconductor layer; and a gate electrode formed on a lower surface of the insulating film so as to be opposed to the semiconductor layer;

wherein an upper surface of the gate electrode protrudes toward the semiconductor beyond an upper surface of the lower wiring pattern layer; and wherein, in the insulating film, a first film thickness of the insulating film opposing to the source electrode, the drain electrode, the upper wiring pattern layer, and the lower wiring pattern layer is thicker than a second film thickness of the insulating film disposed between the gate electrode and the semiconductor layer.

In the flexible semiconductor device according to the present invention configured as described above, since the first film thickness of the insulating film opposing to the source electrode, the drain electrode, the upper wiring pattern layer, and the lower wiring pattern layer is thicker than a second film thickness of the insulating film disposed between the gate electrode and the semiconductor layer, a capacitor portion to be equipped in the semiconductor device can secure a large capacity as well as can minimize a parasitic capacitance occurring across the wiring even in a case of multilayered wiring.

In the flexible semiconductor device according to the present invention, the first film thickness of the insulating film is preferably thicker than the second film thickness of the insulating film by 1 µm or more.

In the flexible semiconductor device according to the present invention, the gate electrode and the lower wiring pattern layer may be made of the same kind of metal. In the flexible semiconductor device according to the present invention, the metal may be selected from aluminum, silver, nickel, iron, copper, or alloy foil containing any one of the above metals as a component.

In the flexible semiconductor device according to the present invention, a profile roughness parameter Ra of an upper surface of the gate electrode in contact with the insulating film is preferably smaller than a profile roughness parameter Ra of an upper surface of the lower wiring pattern in contact with the insulating film.

With the above configuration, fluctuation of the film thickness of the insulating film on the gate electrode that functions as a gate insulating film can be minimized while an adhesion strength between the insulating film and the lower wiring pattern can be kept high and thus the gate insulating film excellent in the electrical characteristics can be formed.

In this case, the profile roughness parameter Ra of the upper surface of the gate electrode is preferably 100 nm or less, and more preferably 50 nm or less, in terms of a Ra value. The profile roughness parameter Ra of the upper surface of the lower wiring pattern is preferably 500 nm or more, and more preferably 1 µm or more, in terms of a Ra value. Accordingly, the adhesion strength between the insulating film and the lower wiring pattern can be kept higher and the electrical characteristics of the insulating film on the gate electrode and the fluctuation of the film thickness can be more minimized.

In the flexible semiconductor device according to the present invention, a sealing layer made of an insulating material is preferably formed on the semiconductor layer so as to cover the semiconductor layer.

The sealing layer may be made of a resin material or may include a film-shaped core material and resin layers laminated on each surface of the core material.

In the flexible semiconductor device according to the present invention, in a case where the flexible semiconductor device further includes an interlayer connection via that electrically connects the source electrode with the lower electrode or the drain electrode with the lower electrode, the interlayer connection via, the gate electrode, and the lower wiring pattern layer are preferably made of the same kind of metal.

In the flexible semiconductor device according to the present invention, a capacitor can be further formed by an upper electrode formed on an upper surface of the insulating film and a lower electrode formed, opposing to the upper electrode, on a lower surface of the insulating film.

A third film thickness of the insulating film disposed between the upper electrode and the lower electrode is preferably thinner than the first film thickness and the third film thickness is preferably thinner than the first film thickness by 1 µm or more.

The flexible semiconductor device according to the present invention includes two layers of insulating films, each of which is provided with the semiconductor device. At the time, the semiconductor device formed such that the two layers of the insulating films are bonded together via an interlayer insulating film and the semiconductor device is formed on each side of the double-layered insulating film is preferably connected via an interlayer connection member provided so as to passing through the interlayer insulating film.

The interlayer insulating film is preferably formed as a sealing layer for covering one of the semiconductor device provided on the two layers of the insulating film.

A method for producing a flexible semiconductor device according to the present invention includes a gate electrode formed on a lower surface of an insulating film and a lower wiring pattern layer connected to a gate electrode, wherein a semiconductor layer opposed to the gate electrode and a source electrode and a drain electrode which are connected to the semiconductor layer are formed on an upper surface of the insulating film, the method including:

a lower electrode wiring forming process for forming one or more protruding parts on one surface of a metal foil;

an insulating film forming process for forming the insulating film on the one surface of the metal foil on which at least one protruding parts are formed such that a film thickness of the insulating film facing the protruding part becomes thinner than a film thickness of recess parts excluding the protruding parts; and a semiconductor layer forming process for forming the semiconductor layer on the insulating film so as to be opposed to at least one of the protruding parts.

In the method for producing a flexible semiconductor device according to the present invention, in the lower electrode wiring forming process, the protruding part can be formed by etching and also can be formed such that a metallic material of the same kind of the metal foil or a metallic material different from the metal foil is laminated on a surface of the metal foil.

In the method for producing a flexible semiconductor device according to the present invention, the protruding parts are preferably formed such that a height thereof becomes 1 µm or more.

In the method for producing a flexible semiconductor device according to the present invention, in the protruding part forming process, each protruding part may have different height.

With the above configuration, an interlayer connection via that connects, for example, the lower wiring pattern layer with the source electrode or the drain electrode can be formed in addition to a gate electrode.

The method for producing a flexible semiconductor device according to the present invention can further includes an upper electrode wiring forming process for forming the source electrode, the drain electrode, and an upper wiring pattern connected to the source electrode or the drain electrode on an upper surface of the insulating film.

In the method for producing a flexible semiconductor device according to the present invention, in the upper electrode wiring forming process, a capacitor element may be formed such that the upper electrode connected to the upper wiring pattern is formed so as to be opposed to at least one of the protruding parts.

The method for producing a flexible semiconductor device according to the present invention may further includes, in the upper electrode wiring forming process, removing a solvent from an electrode wiring pattern after forming the electrode wiring pattern by applying a liquid material in which a conductive material is dissolved in the solvent.

In the method for producing a flexible semiconductor device according to the present invention, the insulating film forming process may further include:

a forming process for forming a coated film by applying a solvent, in which insulating film material is dissolved, to one surface of the metal foil; and a removing process for removing the solvent from the coated film.

In the method for producing a flexible semiconductor device according to the present invention, in the insulating film forming process, an insulating film including a first insulating film and a second insulating film may be formed such that, after the first insulating film is formed, the second insulating film made of an insulating film material identical to or different from the first insulating film is formed in the recess part.

In the method for producing a flexible semiconductor device according to the present invention, the semiconductor layer forming process may include:

a depositing process for depositing a semiconductor material on the insulating film; and a crystallizing process for crystallizing the semiconductor material by heating the deposited semiconductor material.

In the method for producing a flexible semiconductor device according to the present invention, the heat treatment is performed by using laser irradiation.

The method for producing a flexible semiconductor device according to the present invention can further include the heat treatment performed at a temperature of 400° C. or higher.

The method for producing a flexible semiconductor device according to the present invention can further include a sealing process for embedding the source electrode, the drain electrode, and the semiconductor layer between the insulating film and the resin sheet to seal them therebetween by pressure bonding a resin sheet on the upper surface of the insulating film.

In the method for producing a flexible semiconductor device according to the present invention, the method for producing a flexible semiconductor device produces two first and second flexible semiconductor devices, and a lower wiring pattern of the first flexible semiconductor device and an upper wiring pattern of the second flexible semiconductor device are subjected to a pressure bonding while being opposed to each other via a resin sheet, thereby bonding the first flexible semiconductor device and the second flexible semiconductor device together.

Further, a via is preferably formed in the resin sheet such that one end of the via is connected to a gate electrode or a lower wiring pattern of the first flexible semiconductor device and the other end of the via is connected to an upper wiring pattern of the first flexible semiconductor device.

As described above, according to the flexible semiconductor device of the present invention, the parasitic capacitance and the leakage current which occurs across the wiring and induces a delay and a loss can be reduced, sufficient capacity can be secured in the capacitor element formed in the gate insulating film portion of the semiconductor device such as the TFT element and/or in the substrate, and thus the characteristics of each element can be improved.

The method for producing a flexible semiconductor device of the present invention provides a method capable of producing a flexible semiconductor device of the present invention.

The method for producing a flexible semiconductor device of the present invention can produce a flexible semiconductor device with a simplified producing process because use of the metal foil as the support substrate enables a formation of the recess parts and the protruding parts with a simple process and enables an adjustment of the film thickness of the insulating film.

Further, since the metal foil is used as the support substrate, a semiconductor material and an insulating film material excellent in characteristics required in a high-temperature process performed at a temperature higher than a temperature used in forming the resin substrate as the support substrate can be used.

Therefore, the production method according to the present invention can provide a flexible semiconductor device of a high performance and excellent in productivity.

BRIEF DESCRIPTION OF THE DRAWINGS

FIG. 1(a) is a schematic cross sectional view showing a cross section of a flexible semiconductor device 100 according to an embodiment of the present invention; and FIG. 1(b) is a top schematic view showing an upper surface of the flexible semiconductor device 100 according to the embodiment of the present invention.

FIG. 6(a) is a schematic cross sectional view showing a flexible semiconductor device 500 according to an embodiment of the present invention; FIG. 6(b) is an equivalent circuit view showing a drive circuit of an image display device according to the embodiment of the present invention.

FIGS. 7(a) to 7(c) are cross sectional views, respectively, showing a production process of the flexible semiconductor device 500 according to the embodiment of the present invention.

DETAILED DESCRIPTION OF THE INVENTION

Figure 2:
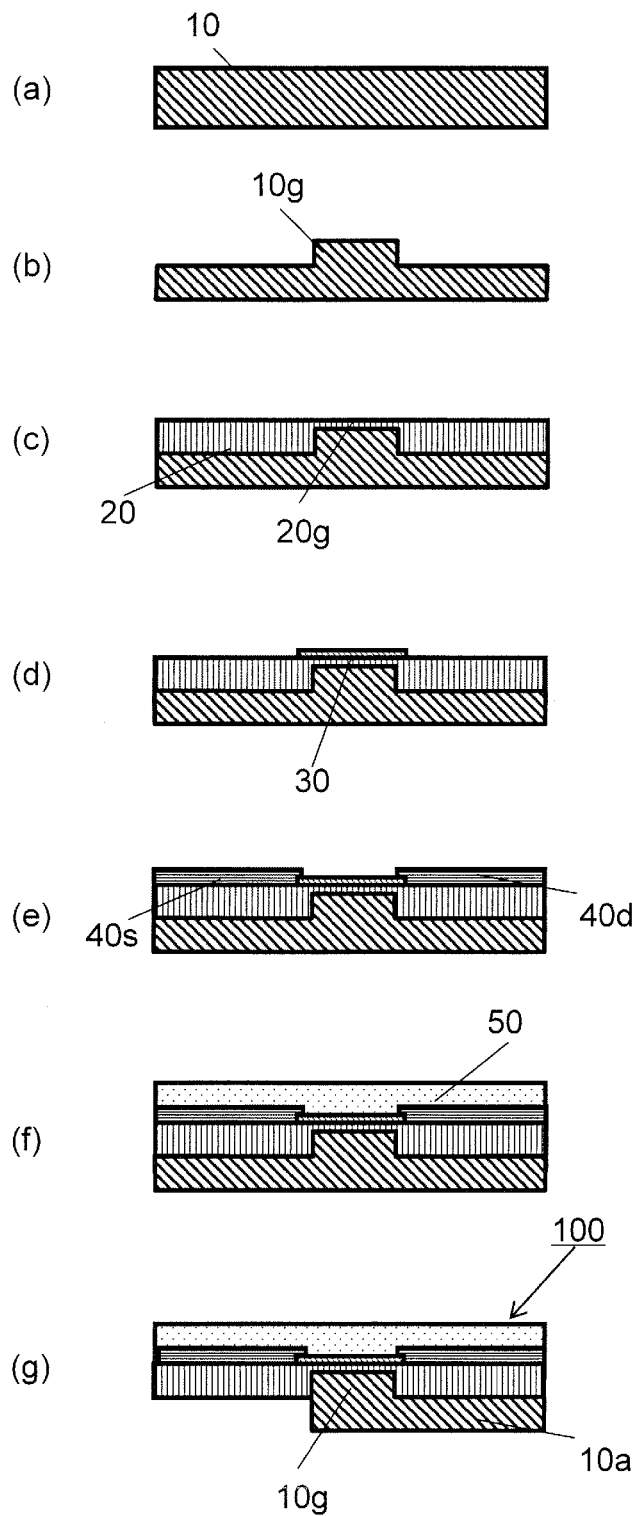
FIGS. 2(a) to 2(g) are cross sectional views, respectively, showing a production process of the flexible semiconductor device 100 according to the embodiment of the present invention.

Embodiments of the present invention will be described below with reference to the accompanying drawings. For the sake of a simple description, components having substantially the same functions are provided with the same reference symbols in the following drawings which referred to. Size relations (for example, length, width, and thickness) in each drawing do not reflect actual size relations thereof. The scope of the present invention is not restricted by the following embodiments.

(First Embodiment)

A flexible semiconductor device 100 according to the first embodiment of the present invention will be described below with reference to FIGS. 1(a) and 1(b).

FIG. 1(b) is a top view schematically showing the flexible semiconductor device 100 and FIG. 1(a) is a cross sectional view, taken along line 1a-1a, schematically showing the flexible semiconductor device 100 of FIG. 1(b).

The flexible semiconductor device 100 includes a TFT structure including an insulating film 20, a source electrode 40s and a drain electrode 40d formed on the insulating film 20, a semiconductor layer 30, a gate insulating film 20g that functions as a gate insulating film in the insulating film 20, and a gate electrode 10g, and a lower wiring pattern layer 10a that is drawn out from the gate electrode 10g to function as a wiring unit.

A sealing layer 50 also takes a roll of a substrate for supporting the TFT structure and thus is preferably formed of a resin material having flexibility capable of being bent even after it is cured. Further, the sealing layer 50 is preferably formed into a thin film as much as possible to the extent being able to support the TFT structure. Typical examples of such a resin material include an epoxy resin, a polyimide (PI) resin, an acrylic resin, a polyethylene terephthalate (PET) resin, a polyethylene naphthalate (PEN) resin, a polyphenylene sulfide (PPS) resin, a polyphenylene ether (PPE) resin, a polyparaxylylene (PPX) resin, and various compounds thereof. These resin materials are excellent in dimensional stability and thus are preferred as a material of the flexible substrate in the flexible semiconductor device 100 of the present embodiment.

In the first embodiment, a semiconductor layer 30 and the source electrode 40s and the drain electrode 40d formed so as to be in contact with the semiconductor layer 30 are embedded in the sealing layer 50. Various materials can be used as a material for the semiconductor layer 30. For example, a semiconductor such as silicon (for example, Si) and germanium (Ge) may be used for the semiconductor layer. Alternatively, oxide semiconductor may be used for the semiconductor layer. Examples of a material of the oxide semiconductor include a single oxide such as a zinc oxide (ZnO), tin oxide ($SnO_2$), indium oxide ($In_2O_3$), and titanium oxide ($TiO_2$), and complex oxides such as InGaZnO, InSnO, InZnO, and ZnMgO. Alternatively, a compound semiconductor (for example, GaN, SiC, ZnSe, CdS, GaAs) and an organic semiconductor (for example, pentacene, poly(3-hexylthiophene), porphyrin derivative, copper phthalocyanine, and C60) can be used for the oxide semiconductor, as required. A metal material having satisfactory electrical conductivity is preferred as a metal composing the source electrode 40s and the drain electrode 40d. For example, copper (Cu), nickel (Ni), aluminum (Al), stainless (SUS), gold (Au), silver (Ag) can be used for the source electrode 40s and the drain electrode 40d.

The insulating film 20 including the gate insulating film 20g is provided under the semiconductor layer 30, the source electrode 40s, and the drain electrode 40d. Materials of the gate insulating film 20g and the insulating film 20 desirably is a high capacity and a low leakage current at the gate insulating film 20g in order to form the TFT having an excellent property. That is, an inorganic compound having a relatively high dielectric constant and excellent in an insulating property is preferred as the material for the gate insulating film 20g and the insulating film 20. Typical examples of the inorganic compound having the dielectric constant and the insulating property include a metal oxide such as a tantalum oxide (for example, $Ta_2O_5$), an aluminum oxide (for example, $Al_2O_3$), a silicon oxide (for example, $SiO_2$), a zeolitic oxide (for example, $ZrO_2$), a titanium oxide (for example, $TiO_2$), an yttrium oxide (for example, $Y_2O_3$), and various nitrides of those metals. Alternatively, the material of the gate insulating film 20g and the insulating film 20 may be the dielectric substance such as barium titanate ($BaTiO_3$), strontium titanate ($SrTiO_3$), and calcium titanate ($CaTiO_3$).

The gate electrode 10g is formed on a lower surface of the gate insulting film 20g. The lower wiring pattern layer 10a connected to the gate electrode 10g is formed into one piece with the gate electrode 10g. In the present invention, specifically, an upper surface of the gate electrode 10g protrudes higher than the upper surface of the lower wiring pattern layer 10a toward the semiconductor layer 30 and a thickness of the gate insulating film 20g on the gate electrode 10g is thinner than a film thickness of the insulating film opposing to the other electrodes and patterns (for example, the source electrode, the drain electrode, the upper wiring pattern layer, the lower wiring pattern layer). A preferable metal material for the gate electrode 10g and the lower wiring pattern layer 10a has satisfactory electrical conductivity. Examples of such metal material include copper (Cu), nickel (Ni), aluminum (Al), and stainless (SUS).

According to the flexible semiconductor device of the first embodiment having the above-mentioned configuration, the parasitic capacitance and the leakage current, which occur across the wiring and induce the delay and the loss, can be reduced and the capacities can be secured in the gate insulating film portion of the semiconductor device such as the TFT element and the capacitor element portion formed in the substrate, thereby capable of improving the characteristics of each element.

A method for producing a flexible semiconductor device 100 of the first embodiment is described below with reference to FIGS. 2(a) to 2(g). FIGS. 2(a) to 2(g) are cross sectional views for describing a production process of the flexible semiconductor device 100. This is described below.

As described in FIG. 2(a), metal foil 10 is prepared. In the first embodiment, for example, SUS foil having a thickness of 70 μm can be used as the metal foil 10.

Subsequently, as described in FIG. 2(b), the metal foil 10 is processed to form a protruding part as the gate electrode 10g. Although it is not shown, the same protruding part is also formed at a portion corresponding to the lower electrode of a capacitor. The protruding part can be formed by, for example, etching. Any suitable etchant may be used according to a material of the metal foil 10. For example, in a case of copper foil or the SUS foil, ferric chloride can be used as the etchant. Metal foil having a small profile roughness parameter Ra, i.e., of a Ra value (i.e., mathematical average roughness) of 100 nm or less is preferably used as the metal foil 10. When the metal foil 10 having a small profile roughness parameter Ra is used, the profile roughness parameter Ra of an upper surface of the protruding part can be minimized and thus the insulating film having little unevenness of the film thickness can be formed on the upper surface of the protruding part. Accordingly, the gate insulating film 20g having an improved withstanding voltage can be formed.

On the other hand, when the protruding part is formed by etching, even in a case where the metal foil having a small profile roughness parameter Ra is used, the profile roughness parameter Ra of an etched surface (i.e., upper surface of the lower wiring pattern) other than the upper surface of the protruding part can be made larger than the that of the upper surface of the protruding part. Accordingly, adhesion strength between the insulating film 20 and the lower wiring pattern 10a can be made stronger. The profile roughness parameter Ra of the upper surface of the lower wiring pattern preferably has the Ra value (i.e., mathematical average roughness) of 500 nm or more by adjusting the etching conditions.

As shown in FIG. 2(c), the insulating film 20 including the gate insulating film 20g is formed on the metal foil 10 provided with the protruding part formed thereon in step 2(b).

The formation of the insulating film 20 can include a process of the metal foil 10 that is executed at the heat resistant temperature. Examples of a method for forming the insulating film 20 include a sol-gel process and a chemical synthetic procedure.

In the first embodiment, the insulating film 20 made of barium titanate is formed such that, for example, a dispersed solution including nanoparticles of the barium titanate (BaTiO$_3$) dispersed therein is applied to the metal foil 10 to be dried, followed by a temporarily firing and a main firing (for example, at a firing temperature between 600° C. and 800° C.) under a nitrogen atmosphere. The dispersed solution can be applied by using any coating method. For example, a dipping method, a spin coating method, a roll coating method, a curtain coating method, a spraying method, and a droplet discharge method can be used. The insulating film 20 produced by the baking treatment (i.e., high-temperature process) is especially preferred as a material of the insulating film 20 in the flexible semiconductor device 100 since it has more improved dielectric constant than that of the polymeric material.

With the use of the dipping method, the spin coating method, the roll coating method, the curtain coating method, the spraying method, the droplet discharge method, the surface of the insulating film can be made flat with ease even in a case where the insulating film is formed on the surface of the metal foil 10 including unevenness because of the formation of the protruding part.

However, in the present invention, the other general thin film forming method can be used as the method for forming the insulating film 20. Examples of the general method for forming the insulating film 20 include a vacuum deposition method, a laser ablation method, a sputtering method, and a CVD method (for example, plasma CVD method). In the laser ablation method, a film can be formed with less change in composition of the inorganic compound. The CVD method is preferred because the inorganic insulating film can be formed with ease, a multi-component film can be formed, and the high-dielectric constant film can be formed.

As shown in FIG. 2(d), a semiconductor layer 30 opposing to the gate electrode 10g is formed on the gate insulating film 20g. The semiconductor layer 30 is formed, for example, such that the semiconductor material is deposited on the upper surface of the insulating film 20. The semiconductor material can be deposited by using a print process such as a thin-film formation process, for example, the vacuum deposition method, the sputtering method, and the plasma CVD method and an ink jet method.

The formation of the semiconductor layer 30 can include a process executed at a temperature not exceeding the heat resistant temperature of the metal foil 10 and the insulating film 20. For example, the formation is preferably performed such that the semiconductor material is deposited on the insulating film 20, followed by providing a heat treatment to thus deposited semiconductor material. The semiconductor material may be heated by any method. For example, the semiconductor material may be heated by an annealing treatment (i.e., atmosphere heating), a laser annealing treatment, or a combination of the both treatment. As described above, the heat treatment (i.e., high-temperature process) facilitates crystallization of the semiconductor, resulting in improvement of the semiconductor property (i.e., typical carrier mobility).

In the first embodiment, for example, the semiconductor layer 30 can be formed in a manner as described below. First, a cyclopentasilane-containing solution is irradiated with UV light to obtain a higher order silane compound and subsequently the higher order silane compound-containing solution is applied to the upper surface of the inorganic insulating film 20. Then, the heat treatment is provided at a temperature between 300° C. and 600° C. to form the semiconductor layer 30 made of amorphous silicon. The laser annealing treatment is subsequently provided to form a polysilicon film having high carrier mobility. Any coating method can be used for applying the solution. For example, the spin coating method, the roll coating method, the curtain coating method, the spraying method, and the droplet discharge method may be used.

In a case of the oxide semiconductor, for example, a mixture of the organic metal is deposited on the insulating film 20 and the resultant is subjected to the heat treatment (for example, at a temperature of 600° C. or higher) to sinter it. Accordingly, the oxide semiconductor having the high carrier mobility can be formed.

As shown in FIG. 2(e), the source electrode 40s and the drain electrode 40d are formed so as to be in contact with the semiconductor layer 30 and the upper wiring pattern layer including the source electrode 40s and the drain electrode 40d is formed. The upper wiring pattern layer including the source electrode 40s and the drain electrode 40d can be formed by any method, i.e., can be formed with ease by using, for example, the vacuum deposition method or the sputtering method. Other methods such as a method in which printing is performed with the organic metal paste, followed by curing thereof and a method in which printing is performed with nanometal particle ink by using the ink jet method, followed by firing thereof may be used. Examples of a material of the source electrode 40s and the drain electrode 40d include metallic materials such as gold (Au), silver (Ag), copper (Cu), Nickel (Ni), chrome (Cr), cobalt (Co), magnesium (Mg), Calcium (Ca), platinum (Pt), molybdenum (Mo), iron (Fe), and zinc (Zn); and electrically conductive oxides such as tin oxide (SnO$_2$), indium tin oxide (ITO), fluoride-containing tin oxide (PTO), ruthenium oxide (RuO$_2$), iridium oxide (IrO$_2$), and platinum oxide (PtO$_2$).

As shown in FIG. 2(f), the sealing layer 50 is formed so as to over a surface on which the semiconductor layer 30, the source electrode 40s, and the drain electrode 40d are formed. Any method can be employed as the method for forming the sealing layer 50. For example, a method in which a semi-cured resin sheet is laminated on the semiconductor layer 30, the source electrode 40s, and the drain electrode 40d to cure it (in this case, an adhesive material may be applied to the laminated surface of the resin sheet) and a method in which semi-cured resin is applied to the semiconductor layer 30, the source electrode 40s, and the drain electrode 40d by spin coating to cure it may be employed. The formation of the sealing layer 50 enables a protection of the semiconductor layer 30 as well as a stable handling of the next step (for example, etching treatment of the metal layer 10) and a stable conveyance thereof.

In the first embodiment, the sealing layer 50 is formed such that the resin sheet 50 is pressure-bonded (i.e., bonded while pressuring) to the surface on which the semiconductor layer 30, the source electrode 40s, and the drain electrode 40d are formed. With the pressure bonding, the surface is laminated with the resin sheet 50 to be formed into one piece and the semiconductor layer 30, the source electrode 42s, and the drain electrode 42d are embedded in the resin sheet 50.

For example, a method in which the sealing layer 50 is pressurized against the surface while being subjected to the heating treatment by, for example, the roll lamination method, the vacuum lamination method, and the hot press method may be employed. For example, a sheet in which an adhesive material (for example, an epoxy resin, an acrylic resin, a polyimide resin) is applied to a surface of a resin film and an uncured resin film can be used as the resin sheet 50. Herein, a sheet in which an adhesive epoxy resin is applied to a surface of a polyimide resin film having a thickness of 12.5 μm is prepared as the resin sheet 50 to be laminated on the upper surface of the insulating film 20 so as to be one piece.

As shown in FIG. 2(*g*), the metal foil 10, with the protruding part formed thereon as the gate electrode 10*g*, is etched to form the gate electrode 10*g* and the lower wiring pattern layer 10*a* from the metal foil 10. Any suitable etchant may be used according to the material of the metal foil 10. For example, in a case of copper foil or SUS foil, ferric chloride can be used as the etchant.

Accordingly, the flexible semiconductor device 100 according to the first embodiment can be formed. According to the producing method of the first exemplary embodiment, the insulating film of the upper wiring pattern layer and the lower wiring pattern layer including the source electrode and the drain electrode can be made thicker with a simple method and the insulating film on a capacitor portion formed within the gate insulting film portion of the TFT element and the substrate can be made thinner, resulting in that the parasitic capacitance and the leakage current occurring across the wiring can be limited and a semiconductor device and a capacitor having improved characteristics can be produced with more productivity.

Further, according to the producing method of the first embodiment, the protruding part as the gate electrode 10*g* is formed on the metal foil 10 in order to make the insulating film formed on the protruding part thinner by the protruding part, so that the surface of the insulating film can be made flat and thus the semiconductor layer 30, the source electrode, and the drain electrode can be formed on the flat surface with better accuracy.

Further, the capacitor portion having a necessary capacity can be formed without forming the dielectric substrate layer of the capacitor portion to be installed in the semiconductor device or the circuit by a process different from that of the insulating film and without using the material having the high-dielectric constant.

Since the metal material is used as the support substrate, a semiconductor material and an insulating film material excellent in characteristics required in a high-temperature process performed at a temperature higher than a temperature used in forming the resin substrate as the support substrate can be used. Therefore, according to the producing method of the present invention, a flexible semiconductor device of high performance and excellent in the productivity can be provided.

Before the process of forming the sealing layer 50, a plurality of TFTs are subjected to a test and an assessment one by one and only the TFTs which are given a satisfactory assessment are selected therefrom in order to form the sealing layer 50. With the above-mentioned structure, occurrence of the defective pieces in the final products can be prevented during the producing process. As a result thereof, the material or the like required in the following process can be saved. Since the sealing layer 50 is formed on the semiconductor layer 30 after the test and the assessment, the sealing layer 50 as a good-quality protective layer can be relieved from occurrence of the defective pieces and degradation of the semiconductor property in the following process and thus can have improved reliability.

A configuration of a flexible semiconductor device and a producing method thereof according to another embodiment of the present invention will be described below.
(Second Embodiment)

Figure 3:
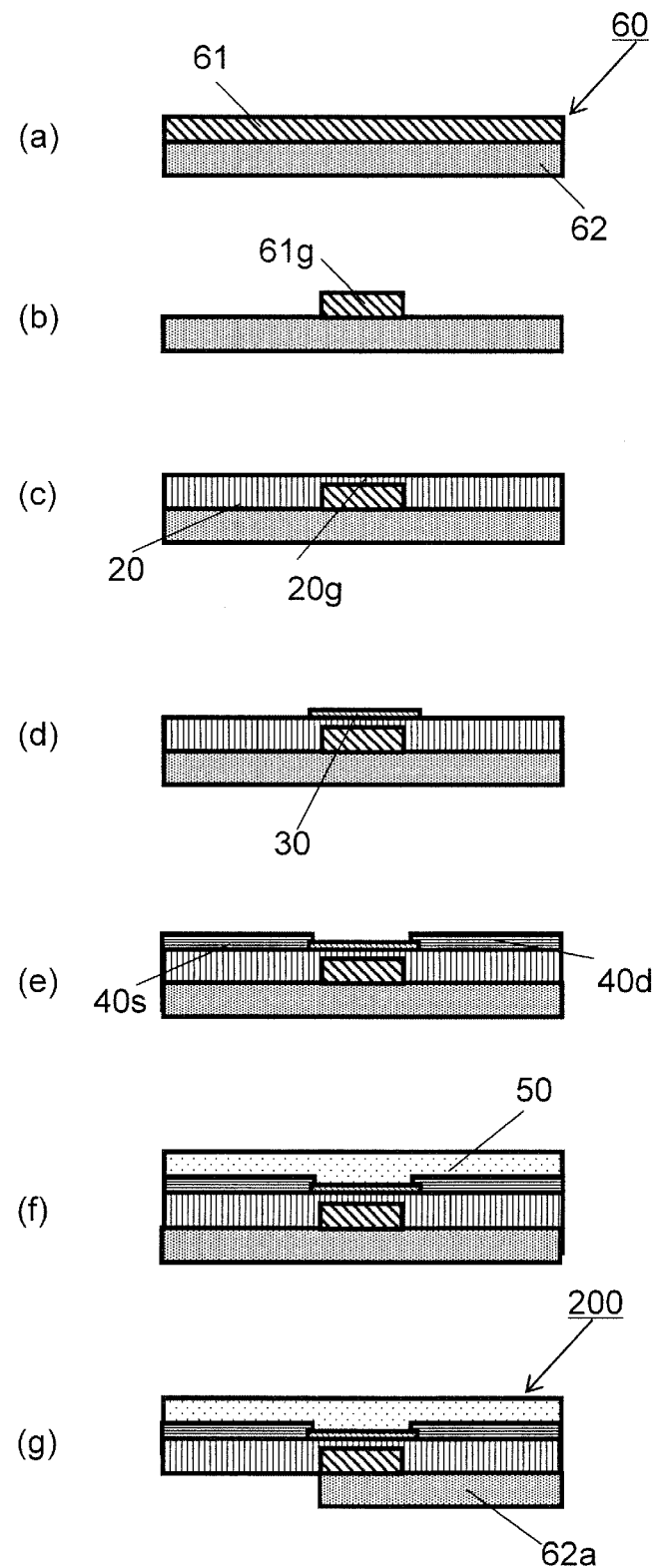
FIGS. 3(a) to 3(g) are cross sectional views, respectively, showing a production process of a flexible semiconductor device 200 according to an embodiment of the present invention.

FIG. 3 shows a configuration of a flexible semiconductor device 200 according to another embodiment of the present invention. The second embodiment differs from the first embodiment in that multilayered metal foil including more than two layers made of different metal materials is used. More specifically, the metal foil prepared here has a multilayered structure and the gate electrode 10*g* and the lower wiring pattern layer 10*a* are made of different metal materials.

An example of a producing process of the second embodiment is described below with reference to FIGS. 3(*a*) to 3(*g*). Descriptions of portions other than the contents specifically referred to and duplicative with those of the first embodiment are omitted herein.

As shown in FIG. 3(*a*), multilayered metal foil 60 including a first metal layer 61 and a second metal layer 62 laminated each other is prepared. The first metal layer 61 and the second metal layer 62 are preferably made of a metal having an electrical conductivity and relatively-high melting point. For example, copper (Cu having the melting point at 1083° C.), nickel (having the melting point at 1453° C.), aluminum (having the melting point at 660° C.), stainless (SUS), and a combination thereof can be used as the material of the first metal layer 61 and the second metal layer 62. Also, a material in which an electrically conductive oxide is deposited on the second metal layer 62 can be used. Any laminating method can be employed. For example, the vacuum deposition method, the sputtering method, the plasma CVD method, and a plating method can be used as the laminating method. In the present embodiment, SUS foil having a thickness of 70 μm is used as the second metal foil 62 and the multilayered foil 60 including a Cu layer having a thickness of 2 μm is used as the first metal foil 61.

As shown in FIG. 3(*b*), the first metal layer 61 of the multilayered metal foil 60 is etched to form a capacitor electrode portion (not shown) from the first metal layer 61, the capacitor electrode portion being formed in the gate electrode 61*g* and the circuit. In the second embodiment, patterns of the gate electrode 61*g* and the capacitor electrode portion are formed by etching the first metal layer 61. However, in FIG. 3(*a*), the patterns of the gate electrode 61 and the capacitor electrode portion can be formed concurrently with a deposition of the first metal layer 61 by using a mask.

As shown in FIGS. 3(*c*) to 3(*f*), the insulating film 20 and the gate insulating film 20*g* are formed in a similar manner as shown in FIGS. 2(*c*) to 2(*f*), the semiconductor layer 30 is formed on the insulating film 20, the upper wiring pattern layer including the source electrode 40*s* and the drain electrode 40*d* is formed, and subsequently the resin layer 50 is formed so as to cover the surface on which the upper wiring pattern layer including the semiconductor layer 30, the source electrode 40*s* and the drain electrode 40*d* is formed.

As shown in FIG. 3(*g*), the second metal layer 62 is etched to form the lowering pattern layer 62*a* from the second metal layer 62. Any suitable etchant may be used according to a material of the second metal foil 62. For example, in a case of copper foil or SUS foil, ferric chloride can be used as the etchant.

As described above, the flexible semiconductor device 200 according to the second embodiment can be structured. According to the producing method of the second embodiment, selection of the materials of the first metal layer 61 and the second metal layer 62 which have different etching rate and requires different etchant enables an easy control of a thickness of the insulating film disposed between the upper wiring pattern layer including the source electrode 40s and the drain electrode 40d and the lower wiring pattern layer. Accordingly, the flexible semiconductor device having a highly accurate structural design considering electrical characteristics can be provided by forming the insulating film having a desired thickness, i.e., the flexible semiconductor excellent in the electrical characteristics can be provided.

(Third Embodiment)

Figure 4:
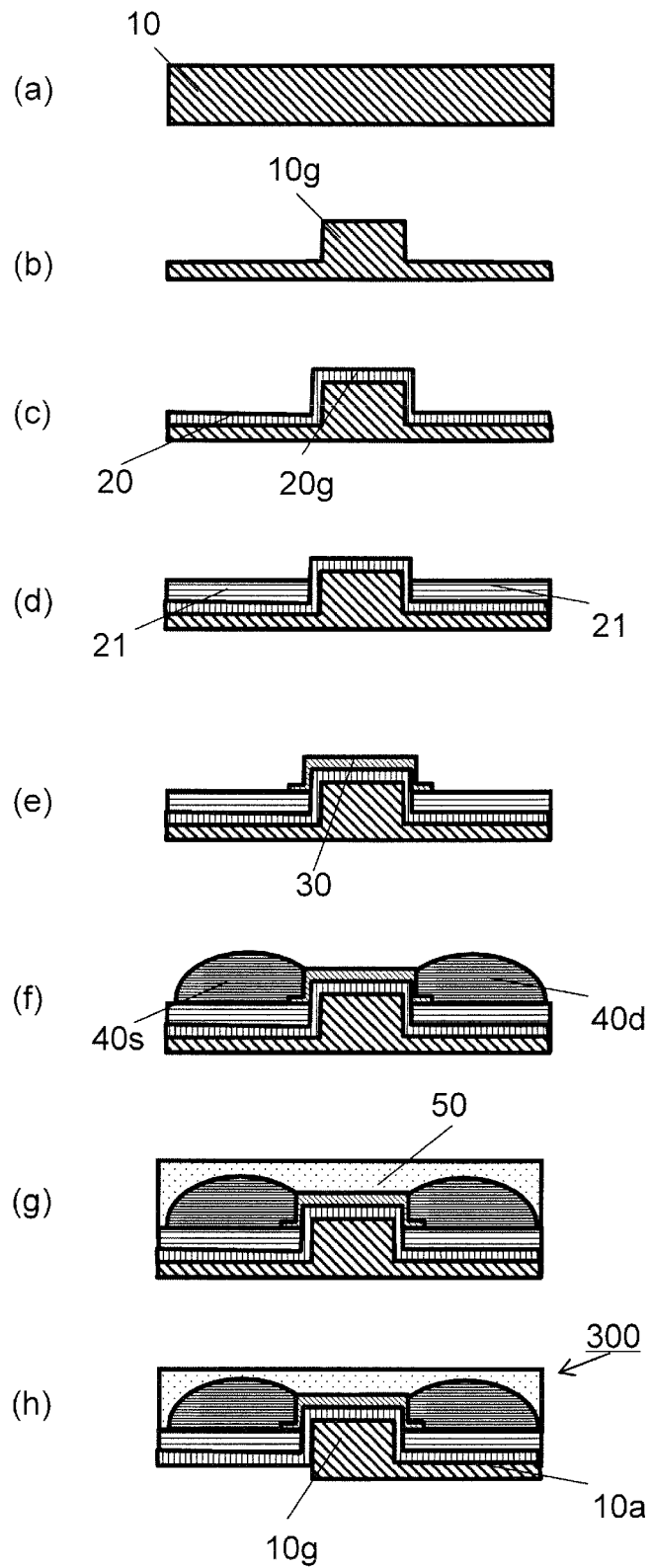
FIGS. 4(a) to 4(h) are cross sectional views, respectively, showing a production process of a flexible semiconductor device 300 according to an embodiment of the present invention.

FIG. 4 shows a configuration of a flexible semiconductor device 300 according to another embodiment of the present invention. The third embodiment differs from the first embodiment in that the insulating film 20 together with the second insulating film 21 is formed in the recess parts formed on the metal foil 10. An example of the producing process thereof will be described below with reference to FIGS. 4(a) to 4(h). Descriptions of portions other than the contents specifically referred to and duplicative with those of the first embodiment are omitted herein.

As shown in FIG. 4(a), the metal foil 10 is prepared (for example, by producing or purchasing). In the present embodiment, for example, SUS foil having a thickness of 70 μm can be used as the metal foil 10.

As shown in FIG. 4(b), the metal foil 10 is etched to form protruding parts as the gate electrode and the capacitor electrode on the metal foil 10 and the recess parts other than the protruding parts.

As shown in FIG. 4(c), the insulating film 20 including the gate insulating film 20g is formed on the metal foil 10 on which the protruding parts and the recess parts are formed in process 4(b). The insulating film 20 is, for example, formed into a thickness identical to those of the protruding parts and the recess parts. For example, the sol-gel process and the chemical synthetic procedure can be used as the method for forming the insulating film 20. For example, the dipping method, the spin coating method, the roll coating method, the curtain coating method, the spraying method, and the droplet discharge method can be used as the method for applying a solution of the insulating film 20. Further, a general thin film forming method such as the vacuum deposition method, the laser ablation method, the sputtering method, the CVD method (for example, plasma CVD method) can be used for forming the insulating film. With the thin-film forming methods, the insulating film 20 having even thickness throughout the protruding parts and the recess parts can be formed with ease. Further, the insulating film 20 may be a metal oxide film of the metal constituting the metal foil 10. In this case, the insulating film 20 can be formed by oxidizing the upper surface of the metal foil 10. The metal foil 10 is oxidized by, for example, an anodizing process, a thermal oxidation method (i.e., surface oxidation treatment by heating), a chemical oxidation method (i.e., surface oxidation treatment by an oxidizer). In a case where the insulating film 20 is the metal oxide film of the metal foil 10, the metal that constitutes the meal foil 10 may be any metal that can be oxidized by the oxidation treatment. However, preferably, a valve metal (for example, aluminum and tantalum) is used for the metal. In a case of the valve metal, the anodizing process can be applied to form the oxide film on the surface of the metal with ease (for example, a thickness of 1 μm or less, and more preferably 0.6 μm or less).

As shown in FIG. 4(d), a second insulating film 21 is further formed with respect to the recess parts formed on the metal foil 10. The second insulating film 21 may be formed of a material different from the insulating film 20 or may be formed of the same material as the insulating film 20. Therefore, the above-mentioned material of the insulating film 20 can be used for the second insulating film 21. Examples of the forming method include the sol-gel process and the chemical synthetic procedure. For example, a droplet discharge method by an ink jet method can be used as the coating method. Also, a general thin film forming method such as the vacuum deposition method and the sputtering method using a mask can be used.

The thickness of the second insulating film 21 can be set to any value such that a film thickness of the sum of the thickness of the second insulating film 21 and the thickness of the insulating film 20 becomes thicker than the thickness of the insulating film 20. For example, the second insulating film 21 can be formed such that the second insulating film 21 is formed into a recess shape by about 1 μm from the surface of the insulating film 20 formed on the protruding part.

As shown in FIG. 4(e), a semiconductor layer 30 is formed on the gate insulating film 20g formed on the gate electrode 10g in a manner similar to FIG. 2(d) of the first embodiment and FIG. 3(d) of the second embodiment.

As shown in FIG. 4(f), the source electrode 40s and the drain electrode 40d are formed so as to be in contact with the semiconductor layer 30 to form the upper wiring pattern layer including the source electrode 40s and the drain electrode 40d. The method for forming the upper wiring pattern layer including the source electrode 40s and the drain electrode 40d is not limited to any method as identical to the cases of the first embodiment and the second embodiment. The upper wiring pattern layer can be formed with ease by, for example, the vacuum deposition method and the sputtering method. The other method (for example, a method in which an organic metal paste is printed to cure it and a method in which nano-metal particle ink is printed by an ink jet method to sinter it) may also be used. FIG. 4 of the third embodiment shows such an example that the upper wiring pattern layer including the source electrode 40s and the drain electrode 40d is formed by using the ink jet method. Since the gate insulating film 10g is formed into the protruding part so as to make the upper surface of the gate insulating film 10g higher, the protruding part functions as a barrier and thus, in forming the wiring by the ink jet method, it is not necessary to form the barrier in a separate process. As a result thereof, a narrow pitch between the source electrode and drain electrode can be achieved.

As shown in FIGS. 4(g) and 4(h), the resin layer 50 is formed so as to cover the surface on which the upper wiring pattern layer including the semiconductor layer 30, the source electrode 40s, and the drain electrode 40d is formed in a manner as done in the first embodiment and the second embodiment. Then, the metal foil 10 is etched to form the gate electrode 10g and the lower wiring pattern layer 10a from the metal foil 10.

As described above, the flexible semiconductor device 300 according to the third embodiment can be structured. The producing method of the third embodiment enables formation of a TFT element including a thin gate insulating film formed on the gate electrode and having an improved characteristics and limitation of the parasitic capacitance and the leakage current occurring between the upper wiring pattern layer and the lower wiring pattern layer. In a case where the upper wiring pattern layer is formed by the ink jet method, the protruding part as the barrier can be formed with ease and thus a flexible semiconductor device excellent in electrical property and productivity can be provided.

The producing method of the third embodiment can be used according to a function and a purpose, for example, the insulating film 20 constituting the gate oxide and the capacitor portion is formed of a material having a high-dielectric constant and the second insulating film 21 is formed of a material having a low-dielectric constant. Therefore, the parasitic capacitance occurring across the wiring can be reduced more efficiently as well as the capacity of the capacitor portion to be installed in the semiconductor device and the circuit can be made larger.

(Fourth Embodiment)

A producing method of a flexible semiconductor device 400 of the fourth embodiment will be described below with reference to FIGS. 5(a) to 5(h). FIGS. 5(a) to 5(h) are cross sectional views for showing production process of the flexible semiconductor device 400. This is described below.

Figure 5:
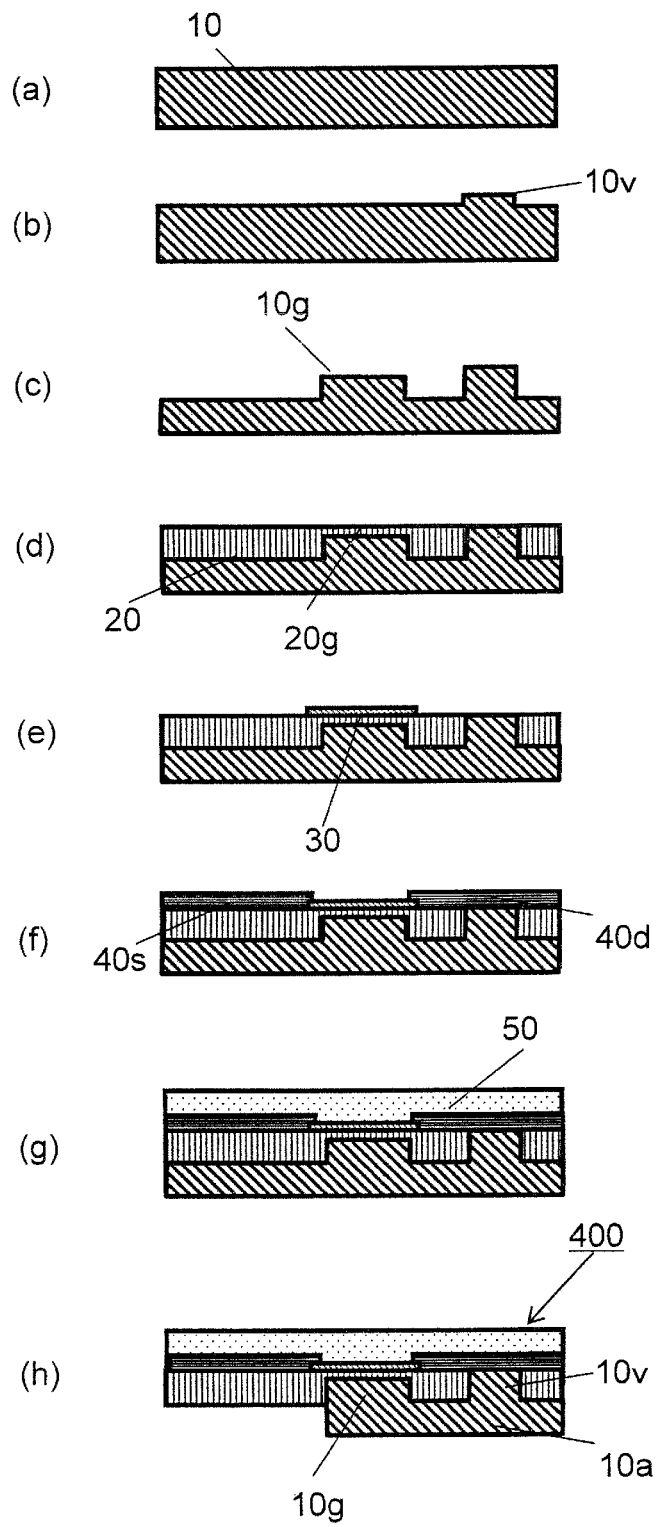
FIGS. 5(a) to 5(h) are cross sectional views, respectively, showing a production process of a flexible semiconductor device 400 according to an embodiment of the present invention.

First, as described in FIG. 5(a), the metal foil 10 is prepared. In the fourth embodiment, for example, SUS foil having a thickness of 70 μm is used as the metal foil 10.

As shown in FIG. 5(b), the metal foil 10 is processed to form the protruding part for constituting an interlayer connection via 10v that electrically connects the upper wiring pattern with the lower wiring pattern. The protruding part can be formed, for example, such that a mask is formed at a position at which the protruding part is formed and thereafter the upper surface of the metal foil 10 is etched. Accordingly the protruding part becomes the same height as a thickness of the gate insulating film 20g formed later or slightly higher than a thickness of the insulating film 20g formed later. Any suitable etchant may be used according to the material of the metal foil 10. For example, in a case of silver foil and SUS foil, ferric chloride can be used.

As shown in FIG. 5(c), the mask is formed at a position at which the protruding part for constituting the gate electrode 10g is formed and thereafter the metal foil 10 is etched to form the protruding part for the gate electrode 10g. Upon formation of the protruding part for the gate electrode 10g, the mask for forming the protruding part for the interlayer connection via 10v is left without removing it and, by using the mask, the protruding part is processed such that the protruding part of the interlayer connection via 10v becomes higher. Any suitable etchant may be used according to the material of the metal foil 10 in the same manner as the process 5(b).

As shown in FIG. 5(d), the insulating film 20 including the gate insulating film 20g is formed on the metal foil 10 provided with the protruding parts formed thereon in the processes 5(b) and 5(c). At the time, the insulating film 20 is formed such that a surface of the interlayer connection via 10v is exposed. For example, the insulating film 20 can be formed selectively only on the surfaces of the recess parts between the protruding parts and the gate electrode 10g by using the droplet discharge method or, after the insulating film 20 is formed on the entire surface by using, for example, the dipping method, the spin coating method, the roll coating method, the curtain coating method, and the spraying method, only the insulating film 20 of the surface of the interlayer connection via 10v is removed by using a laser, thereby being able to expose the surface of the interlayer connection via 10v.

As shown in FIG. 5(e), the semiconductor layer 30 is formed on the gate insulating film 20g so as to be opposed to the gate electrode 10g.

As shown in FIG. 5(f), the source electrode 40s and the drain electrode 40d are formed so as to be in contact with the semiconductor layer 30 to form a layer including the source electrode 40s and the drain electrode 40d. The layer is electrically connected to the exposed surface of the interlayer connection via 10v.

As shown in FIG. 5(g), the sealing layer 50 is formed so as to cover the surface on which the semiconductor layer 30, the source electrode 40s, and the drain electrode 40d are formed.

As shown in FIG. 5(h), the metal foil 10 provided with the protruding parts formed thereon as the gate electrode 10g and the interlayer connection via 10v is etched to form the gate electrode 10g, the lower wiring pattern layer 10a, and the interlayer connection via 10v from the metal foil 10. Any suitable etchant may be used according to the material of the metal foil 10.

As described above, the flexible semiconductor device 400 according to the fourth embodiment can be structured. According to the production method of the fourth embodiment, the gate electrode and the lower wiring pattern can be electrically connected to the source electrode or the drain electrode with a simple method.

(Fifth Embodiment)

A case where the flexible semiconductor device according to the present embodiment is equipped in an image display device will be described below with reference to FIGS. 6(a) and 6(b). FIG. 6(a) is a cross sectional view schematically showing a cross section of a flexible semiconductor device 500 to be equipped in the image display device (i.e., organic EL display here). The flexible semiconductor device 500 includes a plurality of transistor structures. In an example shown in FIG. 6(a), the flexible semiconductor device 500 includes a TFT transistor 500A including a semiconductor layer 30A, a gate insulating film 20Ag, a gate electrode 10Ag, a source electrode 40As, and a drain electrode 40Ad and a TFT transistor 500B including a semiconductor layer 30B, a gate insulting film 20Bg, a gate electrode 10Bg, a source electrode 40Bs, and a drain electrode 40Bd.

In the example shown in FIG. 6(a), the flexible semiconductor device 500 includes a switch TFT transistor 500A (hereinafter referred to as Sw-Tr) and the drive TFT transistor 500B (hereinafter referred to as Dr-Tr). In the present embodiment, the flexible semiconductor device 500 has a laminated structure in which the Dr-Tr 500B is laminated on the Sw-Tr 500A. The source electrode 40As and the drain electrode 40Ad of the Sw-Tr 500A are electrically connected to the gate electrode 10Bg of the Dr-Tr 500B, the lower electrode layer 10Bc of a capacitor 80, and the lower wiring pattern layer 10Ba formed on the Dr-Tr 500B via the interlayer connection members 70, 71, and 72 formed on the sealing layer 50A.

The flexible semiconductor device 500 includes the single capacitor 80. In other words, as shown also in FIG. 6(b), each pixel of the image display device is structured such that two TFT transistors 500A and 500B are combined with the single capacitor 80.

As shown in FIG. 6(b), the gate electrode 10Ag of the Sw-Tr 500A is connected to a selection line 94, the source electrode 40As and the drain electrode 40Ad are connected to a data line 92 and the gate electrode 10Bg of the Dr-Tr 500B, respectively. The source electrode 10Bs and the drain electrode 10Bd of the Dr-Tr 500B is connected to a power-supply line 96 and a display portion (i.e., organic EL device here), respectively. The capacitor 80 is connected to a position between the source electrode 10Bs and the gate electrode 10Bg of the Dr-Tr 500B.

In a pixel circuit having the above-mentioned structure, when a switch of the Sw-Tr 500A is turned on upon operation of the selection line 94, a drive voltage is input from the data line 92, selected by the Sw-Tr 500A, and charged in the capacitor 80. A voltage generated by the charge is applied to the gate electrode 10Bg of the Dr-Tr 500B and a drain current corresponding to the voltage is supplied to a display portion, thereby causing the organic EL device to emit light.

The TFT for display drive as one of uses of the flexible semiconductor device, requires a capacitor having a capacity in order to drive an element. As described above, the direct equipment of the capacitor 80 in the flexible semiconductor device realizes an omission of an independent capacitor outside the flexible semiconductor device 500. Therefore, the image display device of a smaller size and high density package can be realized.

In an example shown in FIG. 6, the lower electrode layer 10Bc of the capacitor 80 is formed in the same surface as the gate electrode 10Bg of the Dr-Tr 500B and made of the shared metal layer 10B. The dielectric substrate layer 20Bc of the capacitor 80 is formed in the same surface as the gate insulating film 20B of the Sw-Tr 500B and is made of the shared insulating film 20B. As described above, according to a parallel positioning of the capacitor 80 and the TFT transistor 500B, the capacitor 80 can be formed from the metal layer 10B and the insulating film 20B and thus the flexible semiconductor device 500 can be simply structured.

A drive circuit (i.e., equivalent circuit) 90 having a structure shown in FIG. 6(a) is schematically shown in FIG. 6(b). In FIG. 6(b), wiring 92 is a data line, wiring 94 is a selection line, and wiring 96 is a power-supply line, respectively. The flexible semiconductor device 500 is formed per each pixel of each image display device. Since provided is not only two TFT elements per each pixel but may be more than two TFT elements depending on the structure of the display, the flexible semiconductor device 50 is to be modified accordingly.

FIG. 7 shows an example of a process for producing the flexible semiconductor device 500 according to a fifth embodiment of the present invention. The process is described below with reference to FIGS. 7(a) to 7(c). Descriptions of portions other than the contents specifically referred to and duplicative with those of the first embodiment are omitted herein.

As shown in FIG. 7(a), the TFT transistor 500B as the Dr-Tr is formed here in the same manner as described in the first embodiment. At the time, the capacitor 80 is formed at a side of the same surface of the insulating film 20B. The TFT transistor is formed such that, when the metal foil 10B is provided with the protruding parts formed thereon as shown in FIG. 2(b), a portion as the gate electrode 10Bg of the TFT element and a portion as the lower electrode layer 10Bc of the capacitor 80 are formed in protruding parts. Then, upon forming the insulating film 20B, the gate insulating film 20Bg and the dielectric substance layer 20Bc of the capacitor are formed. After forming the semiconductor layer 30B, the source electrode 40Bs, and the drain electrode 40Bd, the sealing layer 50B is formed, and the metal layer 10B is processed to form the lower wiring pattern layer 10Ba, the gate electrode 10Bg, and the lower electrode layer 10Bc of the capacitor.

As shown in FIG. 7(b), the TFT transistor 500A as the Sw-Tr that is processed to the process of FIG. 2(e) and the sealing layer 50A including the interlayer connection members 70, 71, and 72 are prepared. For example, a paste via can be used as the interlayer connection member. The interlayer connection members 70, 71, and 72 are made of electrically conductive paste (i.e., paste via) charged into an opening portion for establishing a communication between the upper surface and the lower surface while the sealing layer 50 is made of a sheet-shaped material. A typical example of the electrical conductivity paste includes a mixture of Ag plated coating copper particle and a resin composition mainly including an epoxy resin.

As shown in FIG. 7(c), the TFT transistor 500A is pressure-bonded to the sealing layer 50A, thereby connecting the interlayer connection member 70 with the source electrode 40As and the interlayer connection members 71 and 72 with the drain electrode 40Ad.

A method in which the TFT transistor 500A is applied with a pressure while it is heated by, for example, a roll lamination, a vacuum lamination, and a hot press may be employed as the pressure bonding method. For example, a resin film of which surface is applied with an adhesive material (for example, an epoxy resin, an acrylic resin, and a polyimide resin) and an uncured resin film can be used as the sealing layer 50A. In order to improve barrier properties, a laminate film including an inorganic thin film excellent in the barrier properties sandwiched between a surface of a resin film and an adhesive material can also be used. Herein, a polyimide resin film, having a thickness of 12.5 μm, of which surface is applied with an adhesive epoxy resin is prepared as the sealing layer 50A and is laminated on a surface of the TFT transistor 500A on which the semiconductor layer 30A, the source electrode 40As, and the drain electrode Ad are formed so as to be formed into a lamination.

Further, the lower wiring pattern layer 10Ba, the gate electrode 10Bg, and the lower electrode layer 10Bc of the capacitor formed on the TFT transistor 500B is pressure bonded onto a surface of the sealing layer 50 opposite to a surface on which the TFT transistor 500A is to be pressure bonded so as to be connected to the interlayer connection members 70, 71, and 72 of the sealing layer 50. By the pressure bonding, the TFT transistor 500B and the sealing layer 50 are laminated to be formed into a lamination. The lamination is electrically connected to the gate electrode 10Bg, the lower electrode layer 10Bc of the capacitor 80, and the lower wiring pattern layer 10Ba formed on the Dr-Tr 500B. The pressure bonding of the TFT element 300A and the pressure bonding of the TFT transistor 500B may be performed in the same process or may be performed in the separate process, as required.

The metal layer 10A of the TFT transistor 500A is processed to form the gate electrode 10Ag. In this way, the flexible semiconductor device 500 according to the fifth embodiment of FIG. 6 can be produced.

In the fifth embodiment, the laminated structure is described as the lamination including the plurality of transistors; however, the plurality of transistors can be positioned in the same plane. In a case where the different insulating films 20A and 20B are provided with the transistors, respectively, more wiring can be accommodated in the same element area according to an effect of three-dimensional array of the wirings. More specifically, since the thicker wiring having larger cross section can be used in a case of the same number of wires, a voltage drop due to an interconnection resistance can be reduced and a yield ratio of an etching process for forming wiring can be enhanced.

While the present invention was described according to preferred embodiments, the descriptions thereof do not restrict the scope of the present invention but, as a matter of course, can be modified in various ways. For example, according to a structure of the display, not only two TFT elements is provided for each pixel (i.e., the first TFT element and the second TFT element), but also more than two TFT elements may be provided, so that the flexible semiconductor device of the present embodiment can be modified according to the number of TFT elements. In the above-mentioned embodiment, the flexible semiconductor device is exemplified as being equipped in the organic EL display but may be equipped in the inorganic EL display. The flexible semiconductor device is not limited to be equipped in the EL display but may be equipped in the electronic paper, or, alternatively, is not limited to be equipped in the display but can be equipped in a communication device such as RFID or a memory. The producing method in which the flexible semiconductor device is produced so as to be corresponding to a single device is exemplified, but not limited thereto. The producing method in which the flexible semiconductor device may be produced according to the plurality of devices may be performed. An example of such producing method includes a roll-to-roll producing method.

The flexible semiconductor device according to the present invention is effectively employed by electronic equipment such as the organic EL display and the electronic paper. Further, the flexible semiconductor device according to the present invention is effectively employed not only by the display but also by a communication device such as the RFID and the electronic equipment such as the memory device.

The invention claimed is:

1. A flexible semiconductor device comprising:
   an insulating film; and
   a semiconductor device on the insulating film,
   wherein the insulating film includes an upper wiring pattern layer on an upper surface thereof and a lower wiring pattern layer on a lower surface thereof,
   wherein the semiconductor device comprises
   a semiconductor layer on the upper surface of the insulating film,
   a source electrode and a drain electrode on the upper surface of the insulating film so as to be in contact with the semiconductor layer, and
   a gate electrode on the lower surface of the insulating film so as to be opposed to the semiconductor layer,
   wherein an upper surface of the gate electrode protrudes toward the semiconductor layer beyond an upper surface of the lower wiring pattern layer so that a thickness of the gate electrode is larger than a thickness of the lower wiring pattern layer, and
   wherein, in the insulating film, a first film thickness of the insulating film opposes the source electrode, the drain electrode, the upper wiring pattern layer, and the lower wiring pattern layer is thicker than a second film thickness of the insulating film disposed between the gate electrode and the semiconductor layer.

2. The flexible semiconductor device according to claim 1, wherein the first film thickness of the insulating film is thicker than the second film thickness of the insulating film by 1 µm or more.

3. The flexible semiconductor device according to claim 1, wherein the gate electrode and the lower wiring pattern layer are made from the same metal.

4. The flexible semiconductor device according to claim 3, wherein the metal is selected from a group consisting of aluminum, silver, nickel, iron, copper, or alloy foil containing any one of the above metals as a component.

5. The flexible semiconductor device as in claim 1, wherein a profile roughness parameter Ra of an upper surface of the gate electrode in contact with the insulating film is smaller than a profile roughness parameter Ra of an upper surface of the lower wiring pattern in contact with the insulating film.

6. The flexible semiconductor device as in claim 1, wherein a profile roughness parameter Ra of an upper surface of the gate electrode is 100 nm or less.

7. The flexible semiconductor device as in claim 1, wherein a profile roughness parameter Ra of an upper surface of the lower wiring pattern is 500 nm or more.

8. The flexible semiconductor device as in claim 1, wherein a sealing layer made of an insulating material is disposed on the semiconductor layer so as to cover the semiconductor layer.

9. The flexible semiconductor device according to claim 8, wherein the sealing layer is a resin material.

10. The flexible semiconductor device according to claim 9, wherein the sealing layer is a resin sheet including a film-shaped core material and resin layers laminated on each surface of the core material.

11. The flexible semiconductor device as in claim 1, further comprising an interlayer connection via electrically connecting the source electrode with the lower wiring pattern layer or the drain electrode with the lower wiring pattern layer, wherein the interlayer connection via, the gate electrode and the lower wiring pattern layer the same metal.

12. The flexible semiconductor device as in claim 1, further comprising a capacitor formed by an upper electrode disposed on the upper surface of the insulating film and a lower electrode disposed on the lower surface of the insulating film so as to oppose the upper electrode.

13. The flexible semiconductor device according to claim 12, wherein a third film thickness of the insulating film disposed between the upper electrode and the lower electrode is thinner than the first film thickness.

14. The flexible semiconductor device according to claim 12, wherein a third film thickness is thinner than the first film thickness by 1 µm or more.

15. The flexible semiconductor device as in claim 1, wherein the semiconductor device is one of a first semiconductor device and a second semiconductor device, and the insulating film is one of first and second layers of insulating films, each of the first and second layers of insulating films including one of the first and second semiconductor devices.

16. The flexible semiconductor device according to claim 15, wherein the first and second layers of insulating films are bonded together via an interlayer insulating film and the first and second semiconductor devices disposed on each side of the first and second layers of the insulating films are connected via an interlayer connection member disposed so as to pass through the interlayer insulating film.

17. The flexible semiconductor device according to claim 16, wherein the interlayer insulating film is a sealing layer for covering one of the first and second semiconductor devices disposed on the first and second layers of insulating films.

18. A method for producing a flexible semiconductor device which includes a gate electrode formed on a lower surface of an insulating film and a lower wiring pattern layer connected to the gate electrode, wherein a semiconductor layer opposed to the gate electrode and a source electrode and a drain electrode which are connected to the semiconductor layer are formed on an upper surface of the insulating film, the method compromising:
   forming a lower electrode wiring so as to form one or more protruding parts to be the gate electrode on one surface of a metal foil;
   forming an insulating film on the one surface of the metal foil on which protruding parts are formed such that a film thickness of the insulating film facing the protruding part becomes thinner than a film thickness of recess parts except for the protruding parts; and
   forming a semiconductor layer on the insulating film so as to be opposed to at least one of the protruding parts,
   wherein a thickness of the gate electrode is larger than a thickness of the lower wiring pattern layer.

19. The method for producing a flexible semiconductor device according to claim 18, wherein the protruding parts are formed by etching in the forming the lower electrode wiring.

20. The method for producing a flexible semiconductor device according to claim 18, wherein the protruding part is formed such that a metallic material of the same metallic material of the metal foil or a metallic material different from the metal foil is laminated on a surface of the metal foil.

21. The method for producing a flexible semiconductor device as in claim 18, wherein the protruding part is formed such that a height thereof is 1μm or more.

22. The method for producing a flexible semiconductor device as in claim 18, wherein the protruding parts are formed so as to have different heights.

23. The method for producing a flexible semiconductor device as in claim 18, further comprising forming an upper electrode wiring for forming the source electrode, the drain electrode, and an upper wiring pattern connected to the source electrode or the drain electrode on the upper surface of the insulating film.

24. The method for producing a flexible semiconductor device as in claim 23, wherein an upper electrode connected to an upper wiring pattern is formed so as to be opposed to at least one of the protruding parts in the forming the upper electrode wiring.

25. The method for producing a flexible semiconductor device according to claim 23, wherein forming the upper electrode wiring includes removing a solvent from an electrode wiring pattern after forming the electrode wiring pattern by applying a liquid material in which a conductive material is dissolved in the solvent.

26. The method for producing a flexible semiconductor device as in claim 18, wherein the forming the insulating film includes
forming a coated film by applying a solvent, in which insulating film material is dissolved, to one surface of the metal foil; and
removing the solvent from the coated film.

27. The method for producing a flexible semiconductor device as in claim 18, wherein, forming the insulating film includes forming a first insulating film and forming a second insulating film, wherein the second insulating film is formed after the first insulating film is formed, and wherein the second insulating film is made of an insulating film material identical to or different from the first insulating film, and is formed in a recess part to form the insulating film.

28. The method for producing a flexible semiconductor device as in claim 18, wherein the forming the semiconductor layer includes
depositing a semiconductor material on the insulating film; and
crystallizing the semiconductor material by heating the deposited semiconductor material.

29. The method for producing a flexible semiconductor device according to claim 28, wherein the heating is performed by using laser irradiation.

30. The method for producing a flexible semiconductor device as in claim 28, wherein the heating is performed at a temperature of 400° C. or higher.

31. The method for producing a flexible semiconductor device as in claim 18, further comprising a sealing process for embedding and sealing the source electrode, the drain electrode and the semiconductor layer between the insulating film and a resin sheet by pressure bonding the resin sheet on the upper surface of the insulating film.

32. A method for producing a flexible semiconductor device comprising:
producing a first and second flexible semiconductor devices according to the process as in claim 18;
subjecting a lower wiring pattern of the first flexible semiconductor device and an upper wiring pattern of the second flexible semiconductor device to pressure bonding while being opposed to each other via a resin sheet, thereby bonding the first flexible semiconductor device and the second flexible semiconductor device together.

33. The method for producing a flexible semiconductor device according to claim 32, further comprising forming a via in the resin sheet such that one end of the via is connected to a gate electrode or the lower wiring pattern of the first flexible semiconductor device and the other end of the via is connected to the upper wiring pattern of the first flexible semiconductor device.

* * * * *